(12) United States Patent
Yagyu et al.

(10) Patent No.: US 7,795,944 B2
(45) Date of Patent: Sep. 14, 2010

(54) LOW-OFFSET INPUT CIRCUIT INCLUDING AMPLIFIER CIRCUIT TO CORRECT CIRCUIT CHARACTERISTICS TO CANCEL OFFSET OF THE INPUT CIRCUIT

(75) Inventors: Masayoshi Yagyu, Hanno (JP); Hiroki Yamashita, Hachioji (JP); Takashi Takemoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/183,080

(22) Filed: Jul. 31, 2008

(65) Prior Publication Data

US 2009/0085632 A1 Apr. 2, 2009

(30) Foreign Application Priority Data

Sep. 27, 2007 (JP) ............................. 2007-250370

(51) Int. Cl.
*H03L 5/00* (2006.01)
(52) U.S. Cl. .......................................... 327/307; 330/9
(58) Field of Classification Search ................. 327/307; 330/9
See application file for complete search history.

(56) References Cited

U.S. PATENT DOCUMENTS

| | | | | |
|---|---|---|---|---|
| 5,821,795 A | * | 10/1998 | Yasuda et al. ............... | 327/307 |
| 6,690,225 B2 | * | 2/2004 | Kondo et al. ................ | 327/307 |
| 6,700,514 B2 | * | 3/2004 | Soltanian et al. ............ | 341/118 |
| 6,968,172 B2 | * | 11/2005 | Saito .......................... | 455/306 |
| 7,592,848 B2 | * | 9/2009 | Hayakawa .................. | 327/307 |

\* cited by examiner

*Primary Examiner*—Kenneth B. Wells
(74) *Attorney, Agent, or Firm*—Antonelli, Terry, Stout & Kraus, LLP.

(57) ABSTRACT

In a signal transmission system where an influence of the circuit characteristic variation of an input circuit on signal receiving operation cannot be ignored, there is provided a method of realizing a low-offset input circuit which is capable of conducting high-speed operation and always continuing signal receiving operation without increasing the number of terminals of a semiconductor integrated circuit and without the necessity of providing additional signal observing means and variation adjustment amount calculating means to the external of the semiconductor integrated circuit. In a signal receiver circuit having an input circuit, an automatic zero amplifier, an analog/digital converter circuit, an encoder circuit, and a signal holding circuit, an output error signal of the input circuit is amplified by the automatic zero amplifier, and the signal is digitalized or the digitalized signal is encoded as the occasion demands, and held by the holding circuit, and the circuit characteristic variation of the input circuit is adjusted by the held signal.

8 Claims, 14 Drawing Sheets

LOW-OFFSET INPUT CIRCUIT INCLUDING AMPLIFIER CIRCUIT TO CORRECT CIRCUIT CHARACTERISTICS TO CANCEL OFFSET OF THE INPUT CIRCUIT

CLAIM OF PRIORITY

The present application claims priority from Japanese patent application JP 2007-250370 filed on Sep. 27, 2007, the content of which is hereby incorporated by reference into this application.

FIELD OF THE INVENTION

The present invention relates to a configuration method of a signal input circuit for a semiconductor integrated circuit, and more particularly to an effective technique that is applied to a method of correcting the circuit characteristic variation of an input circuit.

BACKGROUND OF THE INVENTION

There are proposed the following techniques in the configuration of a signal input circuit for a semiconductor integrated circuit.

For example, FIG. 1A shows the configuration of a general signal input circuit. An input circuit 10 receives differential signals Inp and Inn, and outputs an output signal Vout corresponding to difference information Vin between the differential signals.

FIG. 1B shows a circuit diagram of a signal input circuit in a differential configuration. The input signals Inp and Inn are input to the gate terminals of input transistors MN1p and MN1n, respectively. A current that is generated by a constant current generation transistor MNc and a bias voltage Vbias is distributed to two according to a difference voltage between the input signals, and flow in two load resistors RL1p and RL1n. Output signals Outp and Outn are output according to a product of load resistances RL1p and RL1n and currents that flow in the load resistances RL1p and RL1n, respectively.

When the differential signal Vin of the input signal is 0, it is general to design the circuit so that the differential signal Vout of the output signal becomes also 0. In order to achieve this, the input transistors MN1p and MN1n are so designed as to have the same characteristic, and the load resistances RL1p and RL1n are also so designed as to have the same characteristic.

However, when the characteristics of the input transistors MN1p and MN1n are varied for any reason, there occurs a phenomenon that the differential signal Vout does not become 0 even if 0 is supplied to the differential signal Vin. The same is applied to the variation of the load resistances RL1p and RL1n.

An error in the differential signal which is caused by the above circuit characteristic can be represented by an equivalent circuit shown in FIG. 1C. That is, an error voltage Vos that offsets the input signal is applied to any one of the input signals. The error voltage Vos takes a positive or negative value according to the variation of the circuit characteristic. The error voltage Vos is generally called "offset voltage".

According to the study of the present inventors, as a method of correcting the circuit characteristic variation of the signal input circuit described above, there are proposed the following techniques.

For example, FIG. 2A shows a first conventional art for correcting the circuit characteristic variation of the signal input circuit. The first conventional art is configured in such a manner that an output signal of an input circuit 20 is detected by the aid of an observation signal 23 outside of a semiconductor integrated circuit, and a circuit characteristic adjustment signal 22 corresponding to the observation signal is supplied to the semiconductor integrated circuit. The input circuit 20 has a function of adjusting the characteristic of the input circuit per se upon receiving the adjustment signal 22.

Also, for example, FIG. 3A shows a second conventional art for correcting the circuit characteristic variation of the signal input circuit. The second conventional art is configured in such a manner that there is provided an amplifier circuit 32 (automatic zero amplifier) which receives a signal from an input terminal of the input circuit 30, and the circuit characteristic variation of the input circuit 30 is corrected by the aid of an output signal of the automatic zero amplifier 32. The automatic zero amplifier 32 has a function of adjusting its own circuit characteristic variation.

SUMMARY OF THE INVENTION

Incidentally, as a result that the present inventors have studied the technique of correcting the circuit characteristic variation of the above signal input circuit, the following facts have been proved.

First, the technique for correcting the circuit characteristic variation shown in FIG. 2A will be described. FIG. 2B shows a specific circuit example of the method of correcting the circuit characteristic variation which has been described in FIG. 2A. The output signals Outp and Outn of the input circuit 20 are observed as the observation signals 23 through switches SW21a and SW21b outside of the semiconductor integrated circuit, respectively. The adjustment signals 22 corresponding to the observation signals 23 are calculated by waveform observing means 24 and calculating means 25 which are disposed outside of the semiconductor integrated circuit, and then supplied to the input circuit 20. The input circuit 20 has transistors MN27p and MN27n which constitute means for adjusting the circuit characteristic variation by allowing a correction current to flow therein, and adjusts the circuit characteristic according to the adjustment signal 22 from the external.

After the circuit characteristic variation of the input circuit 20 has been corrected by the circuit described above, the switches SW21p and SW21n are brought in an open state as shown in FIG. 2A to conduct normal signal receiving operation.

However, the above system suffers from problems stated below. First, it is necessary to provide the semiconductor integrated circuit with a terminal for extracting the observation signal 23 and a terminal for supplying the adjustment signal 22. Also, it is necessary to provide means 24 for observing the signal and means 25 for calculating the adjustment signal quantity outside of the semiconductor integrated circuit.

Subsequently, a description will be given of the technique for correcting the circuit characteristic variation shown in FIG. 3A.

FIG. 3A is a diagram showing a state of correcting the circuit characteristic variation of the automatic zero amplifier 32 (amplifier circuit). The respective switches shown in FIG. 3A are set as shown in the figure, respectively. That is, a switch SW17 is closed, and the positive and negative input terminals 35 and 36 of the automatic zero amplifier 32 are short-circuited. A positive side output signal 33 of the automatic zero amplifier 32 is connected to a negative side input terminal 36 by means of a switch SW29a, and a negative side output signal 34 is connected to a positive side input terminal 35 by means of a switch SW29b, respectively. Also, the positive side output terminal 33 is connected to a capacitor C15p and a negative side adjustment terminal 38 by means of a switch SW28n. Also, the negative side output terminal 34 is connected to a capacitor C15n and a positive side adjustment terminal 37 by means of a switch SW28b. With the above connection, the automatic zero amplifier 32 is capable of correcting its own circuit characteristic variation, and also the adjustment signals for correction are stored in the capacitors C15p and C15n as charge quantity. In the circuit characteristic variation correction state of the automatic zero amplifier, the switch SW21 is set to the open state, and the input circuit 30 conducts the normal signal receiving operation.

FIG. 3B shows a connection state for correcting the circuit characteristic of the input circuit 31. The adjustment signals for correcting the circuit characteristic variation of the input circuit 31 are generated by the automatic zero amplifier 32, and stored in the capacitors C16p and C16n as the charge quantity. At the same time, the adjustment signals are supplied to adjustment terminals 39a and 39b of the input circuit 30.

In this situation, because the switches SW31a and SW31b are closed, it is impossible that the input circuit 30 correctly receives the received signal Vin to generate the output signal Vout.

FIG. 14 shows the transition of the operating state of the input circuit having the circuit characteristic variation correcting technique shown in FIGS. 3A and 3B. First, the characteristic correction of the automatic zero amplifier 32 is conducted in the setting condition of the switches shown in FIG. 3A, and thereafter the characteristic correction of the input circuit 30 is conducted in the setting condition of the switches shown in FIG. 3B. The reason is because the characteristic of the input circuit 30 must be compensated after the characteristic of the automatic zero amplifier 32 is first compensated, and no circuit characteristic variation of the automatic zero amplifier 32 is secured.

In the techniques shown in FIGS. 3A and 3B, it is necessary that those two characteristic compensation states are alternately repeated. The reason is because the adjustment signal of the automatic zero amplifier 32 and the adjustment signal of the input circuit 30 are stored in the capacitors as the charge quantities, respectively. Because the capacitors constituted on the semiconductor integrated circuit galvanically have the leak characteristic, it is impossible to hold the adjustment signal over an infinite period of time. For that reason, it is necessary to again execute the characteristic compensation and again store the adjustment signals in the capacitors before each of the held adjustment signals has an error which cannot be permitted due to an influence of the leak current.

The circuit characteristic variation correction technique as described with reference to FIGS. 13 and 14 suffer from the following problems. First, in a state where the circuit characteristic of the input circuit 31 is compensated, the input circuit 30 cannot receive the normal signal. For that reason, a period of time during which the normal input signal cannot be received repetitively appears during the circuit operation. Also, because it is necessary to connect the input signal terminal of the automatic zero amplifier 32 to the input signal terminal of the input circuit 30, the load capacitance of the input terminal of the input circuit 30 is increased to prevent the high-speed operation.

Under the above circumstances, an object of the present invention is to provide a signal input circuit having a circuit characteristic variation correcting method, which is not required to add a large number of control terminals to the semiconductor integrated circuit, and not required to provide signal observing means and means for calculating the circuit characteristic variation control signal quantity, and also is capable of continuously conducting the normal signal receiving operation, and is capable of conducting the high-speed circuit operation.

The above and other objects and novel features of the present invention will become apparent from the description of the present specification and the attached drawings.

The summary of the representative features in the invention described in the present application will be described below.

According to the present invention, there is provided a low-offset input circuit, comprising: an input circuit having a function of correcting a circuit characteristic variation according to an adjustment signal that is supplied from the external; an automatic zero amplifier having a function of compensating the circuit characteristic variation of the automatic zero amplifier; a converter circuit that converts an analog signal into a digital signal; and a holding circuit that holds the digital signal or a signal resulting from encoding the digital signal, wherein an error signal of an output signal of the input circuit which is caused by the circuit characteristic variation of the input circuit is amplified by the automatic zero amplifier which corrects the circuit characteristic variation of the automatic zero amplifier by itself in advance, the amplified error signal is converted into the digital signal from the analog signal, the digital signal or the signal resulting from further encoding the digital signal is held by the holding circuit, and there is provided means for correcting the circuit characteristic variation of the input circuit by the aid of the held signal.

The automatic zero amplifier has the means for correcting the circuit characteristic variation of the automatic zero amplifier, and an operating state of correcting the circuit characteristic variation of the automatic zero amplifier, and a state of correcting the circuit characteristic variation of the automatic zero amplifier per is reached before a state of correcting the circuit characteristic variation of the input circuit, thereby making it possible to reduce the circuit characteristic variation of the automatic zero amplifier per se to the degree that the influence of the variation can be ignored with respect to the correction of the circuit characteristic variation of the input circuit.

Also, the holding circuit is capable of holding the signal that has been input at that time, and further continuously outputting according to a signal retention control signal that is supplied from the external.

That is, with the application of the configuration and method as described above, the signal for correcting the circuit characteristic variation of the input circuit is supplied to the circuit characteristic adjustment signal input terminal of the input circuit from the output of the holding circuit, thereby making it possible to correct the circuit characteristic variation so as to be sufficiently small. Also, the correction signal is continuously held, thereby making it possible that the input circuit continuously conducts the normal signal receiving operation.

The above low-offset input circuit is particularly useful as performance deterioration preventing means in a system wherein the circuit characteristic variation of a signal receiver circuit unignorably affects the amplitude of the received signal, such as the receiver circuit with respect to serial signal transmission between LSI in an information processing device represented by, for example, a computer or a network device. The present invention is not limited to the above, but can be widely applied as the signal receiver circuit of the electric signal portion in a system such as an Ethernet signal transmission device using an optical transmission technique.

The advantages obtained by the representative features in the invention described in the present application will be described in brief below.

(1) In the signal input circuit that is formed on the semiconductor integrated circuit, because the circuit characteristic variation of the input circuit can be adjusted, it is possible to prevent the output signal from being deteriorated by an influence of the circuit characteristic variation even in the case where the received signal is small.

(2) Since the means for adjusting the circuit characteristic variation of the input circuit can be formed on the same semiconductor integrated circuit as that of the input circuit, it is possible to prevent an increase in the number of terminals of the semiconductor integrated circuit.

(3) It is unnecessary to provide additional signal observing means and adjustment signal quantity calculating means in the exterior of the semiconductor integrated circuit.

(4) The provision of the means for holding the signal for adjusting the circuit characteristic variation of the input circuit enables the input circuit to continue the normal signal receiving operation.

(5) Since it is unnecessary to connect a circuit such as a switch to the input terminal of the input circuit, it is possible to operate the input circuit at high speed.

BRIEF DESCRIPTION OF THE DRAWINGS

FIGS. 1A, 1B, and 1C are diagrams showing a conventional signal input circuit that has been studied with a view to the present invention, in which FIG. 1A shows an example of an outline configuration, FIG. 1B shows a specific circuit example of FIG. 1A, and FIG. 1C shows an equivalent circuit expression of a case having the circuit characteristic variation;

FIGS. 2A and 2B are diagrams showing a signal input circuit having a conventional circuit characteristic variation compensating function which has been studied with a view to the present invention, in which FIG. 2A shows an example of the outline configuration, and FIG. 2B shows a specific circuit example thereof;

FIGS. 3A and 3B are diagrams showing a signal input circuit having a conventional circuit characteristic variation compensating function which has been studied with a view to the present invention, in which FIG. 3A shows an example of the outline configuration which is a state where the input circuit conducts the normal signal receiving operation, and the automatic zero amplifier conducts the circuit characteristic variation compensating operation, and FIG. 3B shows an example of the outline configuration which is a state where the input circuit conducts the normal signal receiving operation, and the automatic zero amplifier conducts the circuit characteristic variation compensating operation of the input circuit;

FIGS. 4A and 4B are schematic diagrams showing an example of the configuration of a low-offset input circuit according to a first embodiment of the present invention, in which FIG. 4A shows a state in which the input circuit compensates the circuit characteristic variation of the input circuit, and FIG. 4B shows a state in which the input circuit compensates the circuit characteristic variation of the automatic zero amplifier, and a state in which the input circuit conducts the normal signal receiving operation;

FIGS. 6A and 6B are equivalent circuits showing an example of an automatic zero amplifier in the circuit configuration of the low-offset input circuit according to the first embodiment of the present invention, in which FIG. 6A shows a state in which the automatic zero amplifier compensates the circuit characteristic variation of the automatic zero amplifier, and FIG. 6B shows a state in which the automatic zero amplifier is used as a normal amplifier circuit;

DETAILED DESCRIPTION OF THE PREFERRED EMBODIMENTS

Now, a description will be given in detail of embodiments of the present invention with reference to the accompanying drawings. In all of the figures for description of the embodiments, the same members are denoted by identical symbols in principle, and their duplex description will be omitted.

Figure 4A:
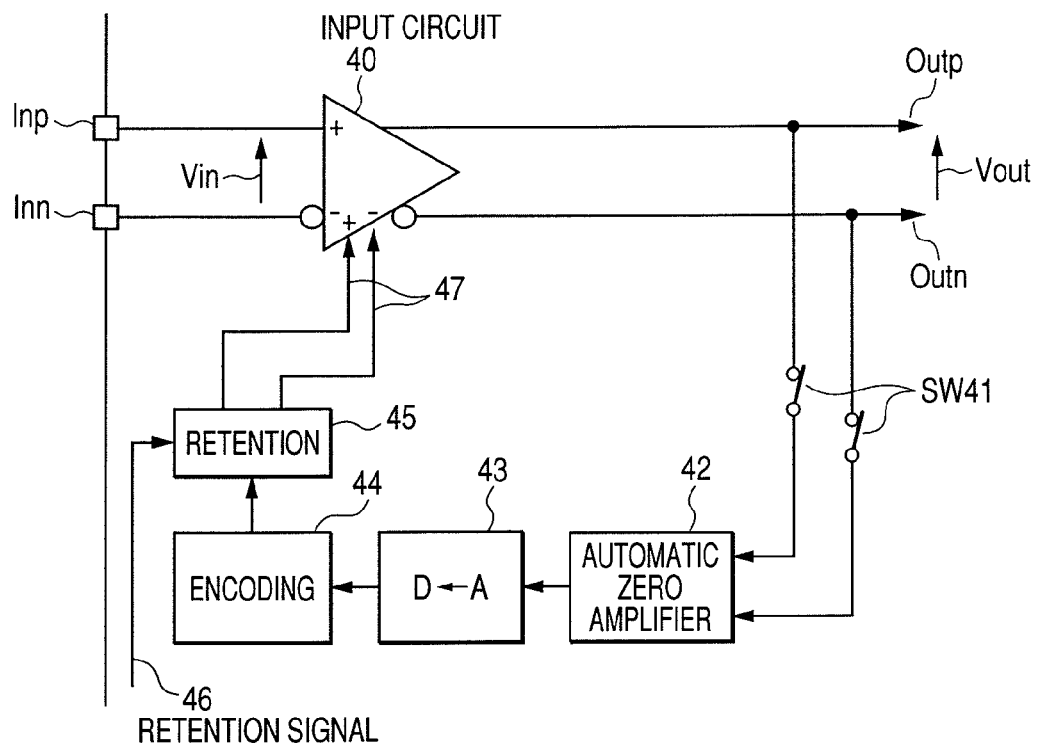
Figure 4B:
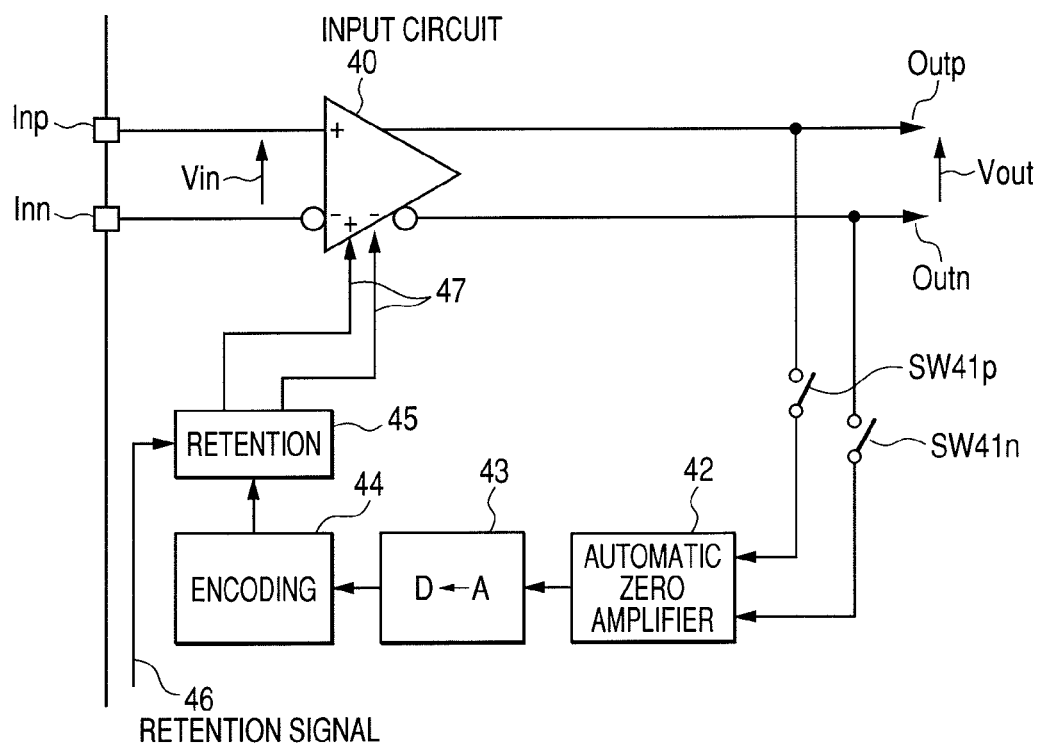

FIGS. 4A and 4B are diagrams showing an example of the configuration of a low-offset input circuit according to a first embodiment of the present invention. FIG. 4A shows a state in which the input circuit compensates the circuit characteristic variation of an input circuit 40. FIG. 4B shows a state in which the input circuit 40 receives a normal signal, and an automatic zero amplifier 42 corrects the circuit characteristic variation of the automatic zero amplifier 42. The circuit according to this embodiment includes the input circuit 40, a switch SW41a, the automatic zero amplifier 42, an analog/digital converter circuit 43 (AD converter circuit), an encoder circuit 44, and a signal holding circuit 45.

Output signals Outp and Outn of the input circuit 40 are input to the automatic zero amplifier 42 through switches SW41p and SW41n, respectively. An analog signal that is output from the automatic zero amplifier 42 is input to an input of the AD converter circuit 43. A digital signal that is output from the AD converter circuit is input to the encoder circuit 44. An output signal of the encoder circuit 44 is sent to the signal holding circuit 45. An output of the signal holding circuit 45 is used as a circuit characteristic adjustment signal 47 of the input circuit 40.

The input circuit 40 receives differential signals Inp and Inn, and outputs differential signals Outp and Outn. A difference signal Vout of the output signal is determined according to difference information Vin of the input differential signal.

FIG. 4A shows a state in which the circuit characteristic variation of the input circuit 40 is corrected. In this situation, the switches SW41p and SW41n are closed, and the outputs Outp and Outn of the input circuit 40 are transmitted to the automatic zero amplifier 42. In this situation, the same signal is also supplied to two input signals Inp and Inn of the input circuit 40. As a result, an error signal Vout corresponding to the circuit characteristic variation of the input circuit 40 per se occurs between the two outputs Outp and Outn of the input circuit 40, and the error signal is input to the automatic zero amplifier 42.

Figure 1A:
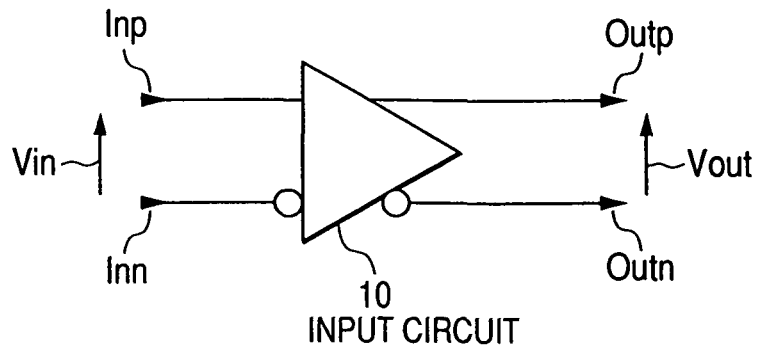
Figure 1B:
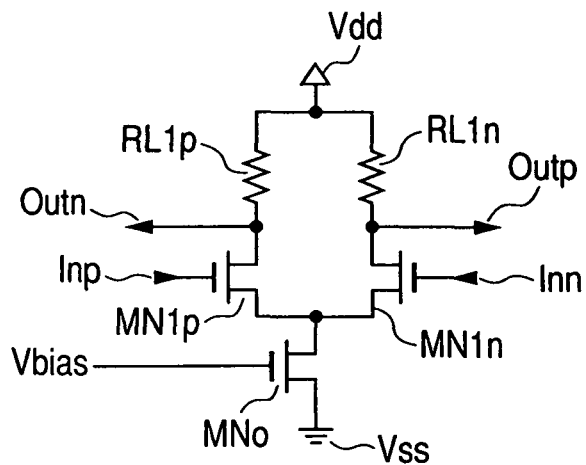
Figure 1C:
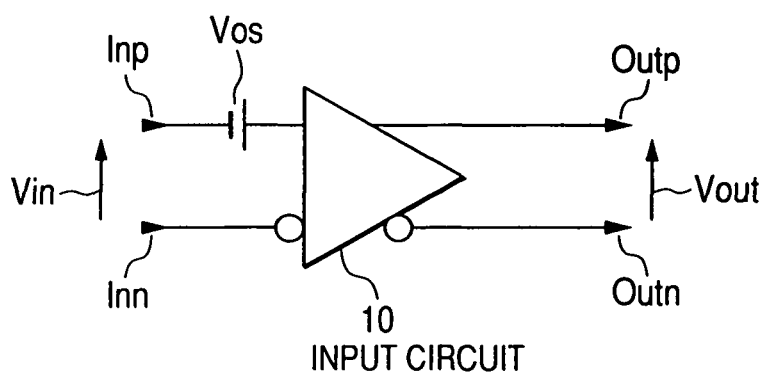
Figure 2A:
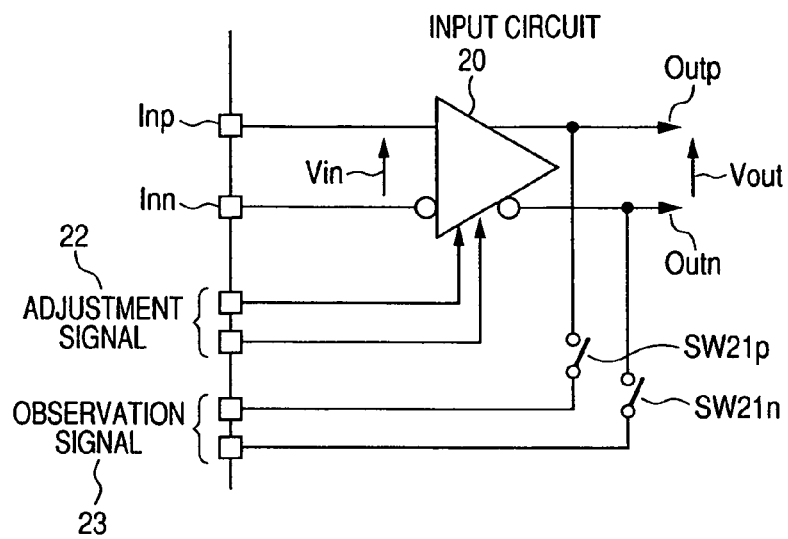
Figure 2B:
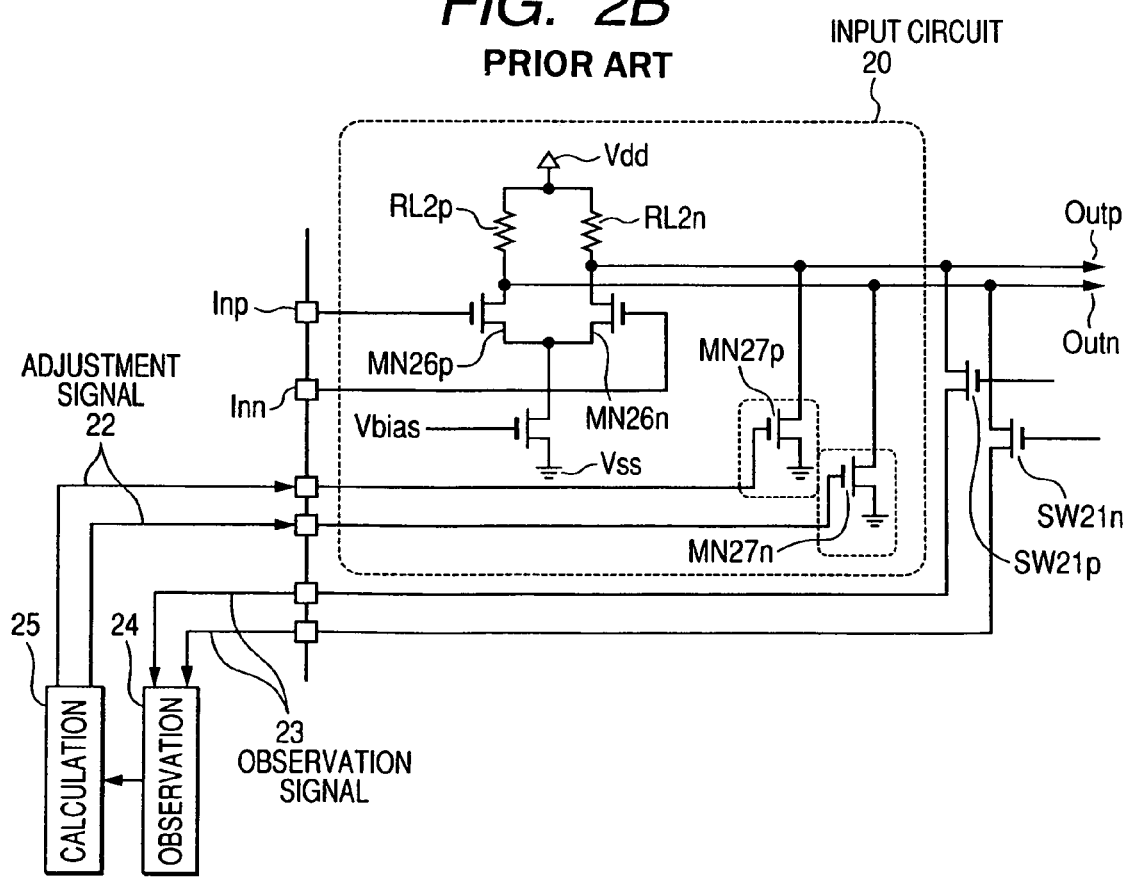
Figure 3A:
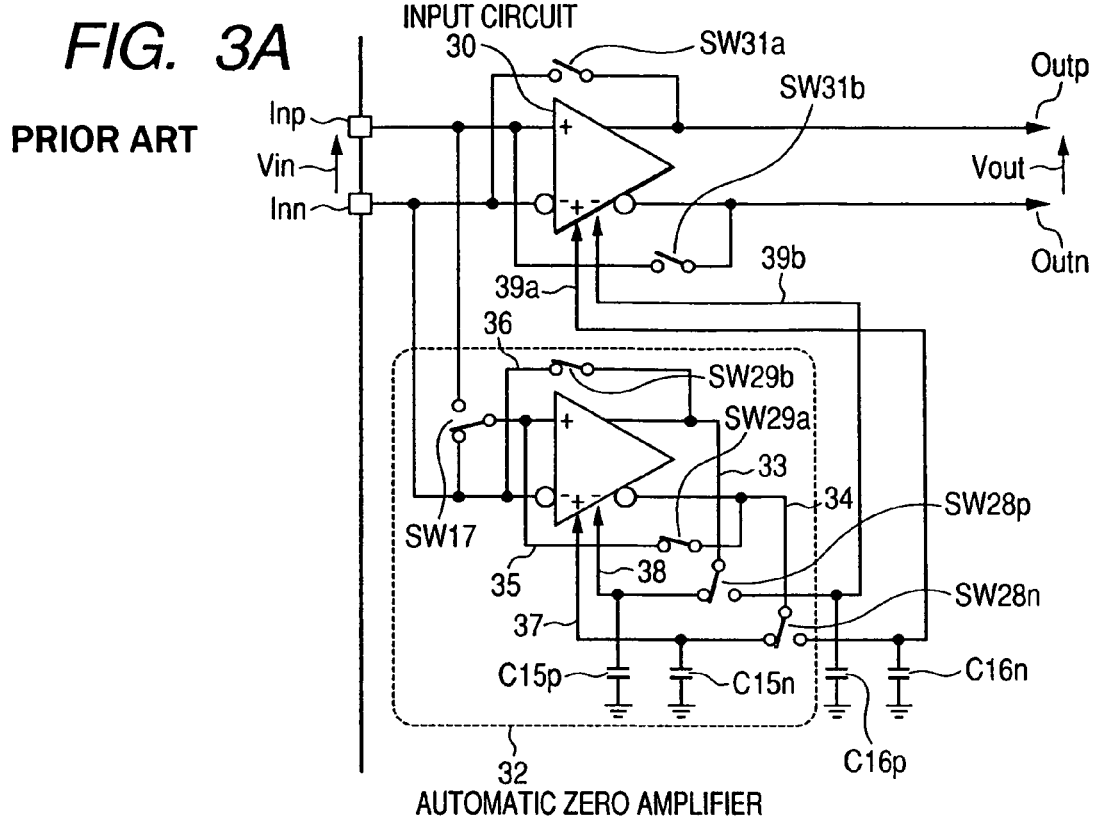
Figure 3B:
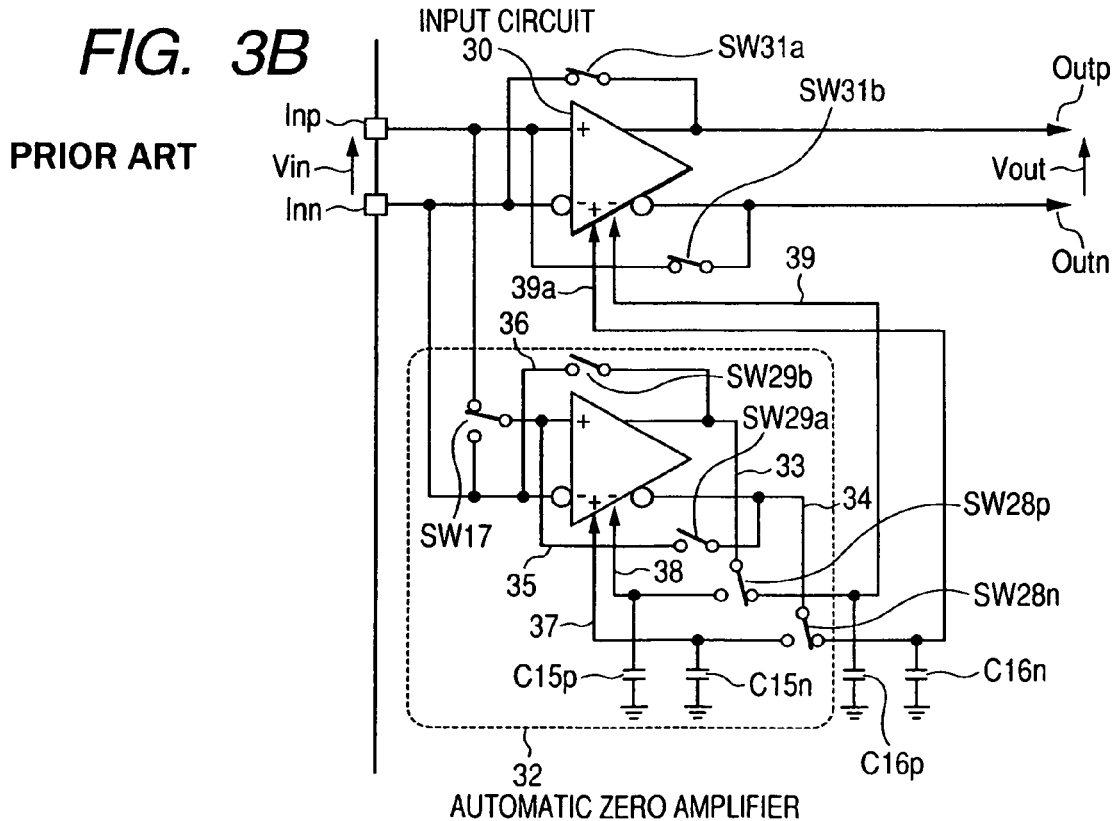

Since a signal that is 0 is supplied to the input signal Vin of the input circuit 40 from the external in a state where the circuit characteristic variation of the input circuit 40 is corrected, a feedback connection from the output terminal of the input circuit 30 to the input terminal is unnecessary. For that reason, it is unnecessary to connect a circuit such as a switch to the input terminal as with the switches SW31a and SW31b shown in FIGS. 3A and 3B, and the high-speed operation of the circuit can be conducted.

The automatic zero amplifier 42 is in a state where the circuit characteristic variation of the automatic zero amplifier per se has been corrected in advance. As a result, it is possible to transmit the output signal corresponding to the error signal Vout that has been transmitted from the input circuit 40 to the AD converter circuit 43. The output of the AD converter circuit 43 is encoded by the encoder circuit 44 as the occasion demands, and then transmitted to the signal holding circuit 45.

During the period of the switch connection state shown in FIG. 4A as described above, the signal holding circuit 45 is controlled according to a retention signal 46, and samples and holds the output signal of the encoder circuit 44.

The output of the signal holding circuit 45 is used as the adjustment signal 47 of the input circuit 40, thereby feeding back the circuit characteristic adjustment information corresponding to the error signal Vout of the input circuit 40. In this case, for example, when the polarity of the adjustment signal 47 is set in advance so that the signal Outp is reduced in the case where the error signal Vout of the input circuit 40 is positive, and the signal Outn is reduced in the case where the error signal Vout is negative, it is possible to correct the circuit characteristic variation of the input circuit 40 by the configuration and method shown in FIG. 4A.

The holding circuit 45 controls the retention signal 46 so as to continuously hold the circuit characteristic variation adjustment signal 47 of the input circuit 40, thereby making it possible to use the input circuit 40 in a state where the circuit characteristic variation is corrected.

FIG. 4B shows a state in which the input circuit 40 receives the normal signals Inp and Inn to generate the outputs Outp and Outn. In this case, the switch SW41 is opened, and the outputs Outp and Outn are not transmitted to the automatic zero amplifier 42. When the switch SW41 is in that state, not only the input circuit 40 conducts the normal operation, but also the automatic zero amplifier 42 is capable of correcting the circuit characteristic variation of the automatic zero amplifier 42 per se during the normal operation. The circuit characteristic variation operation of the automatic zero amplifier 42 per se will be described in detail with reference to FIGS. 6A and 6B later.

As is apparent from the above description, when the input circuit 40 conducts the normal signal receiving operation, a load on the output terminal of the input circuit 40 is not affected by the automatic zero amplifier 42. As a result, the high-speed operation can be conducted. Also, as is apparent from FIGS. 4A and 4B, the input terminal of the input circuit 40 is connected with a switch for correcting the circuit characteristic variation. This is also another reason that the input circuit 40 is capable of conducting the high-speed operation.

Further, in the present invention shown in FIGS. 4A and 4B, another circuit is used for the input circuit 40 and the automatic zero amplifier 42. For that reason, it is possible that the input circuit 40 is subjected to the optimum design for operating with high performance as the input circuit, and the automatic zero amplifier 42 is subjected to the optimum design for operating with high performance as the automatic zero amplifier. This is also a reason that the input circuit 40 is capable of conducting the high-speed operation.

The feature of the present invention shown in FIGS. 4A and 4B resides in that the signal that is used for the circuit characteristic variation adjustment of the input circuit 40 is converted into a digital signal, and held by the holding circuit 45. This technique eliminates the necessity of repeating the circuit characteristic correcting operation of the input circuit which is a problem with the conventional art described with reference to FIGS. 3A and 3B. The interior of the automatic zero amplifier 42 also has a function of holding the correction signal for correcting the circuit characteristic variation of the automatic zero amplifier 42. A circuit that digitalizes and holds the correction signal can be applied to holding of the correction signal within the automatic zero amplifier. However, the configuration shown in FIG. 4 does not always require such a circuit. That is, the error signal that is caused by the circuit characteristic variation of the input circuit is amplified by the automatic zero amplifier that has compensated the circuit characteristic variation of the automatic zero amplifier, converted into the digital signal, and held as the correction quantity. As a result, there can be obtained the advantages of the present invention that the retention characteristic of the correction quantity is excellent, and the operation of the input circuit can be continued in an offset corrected state.

Figure 5:
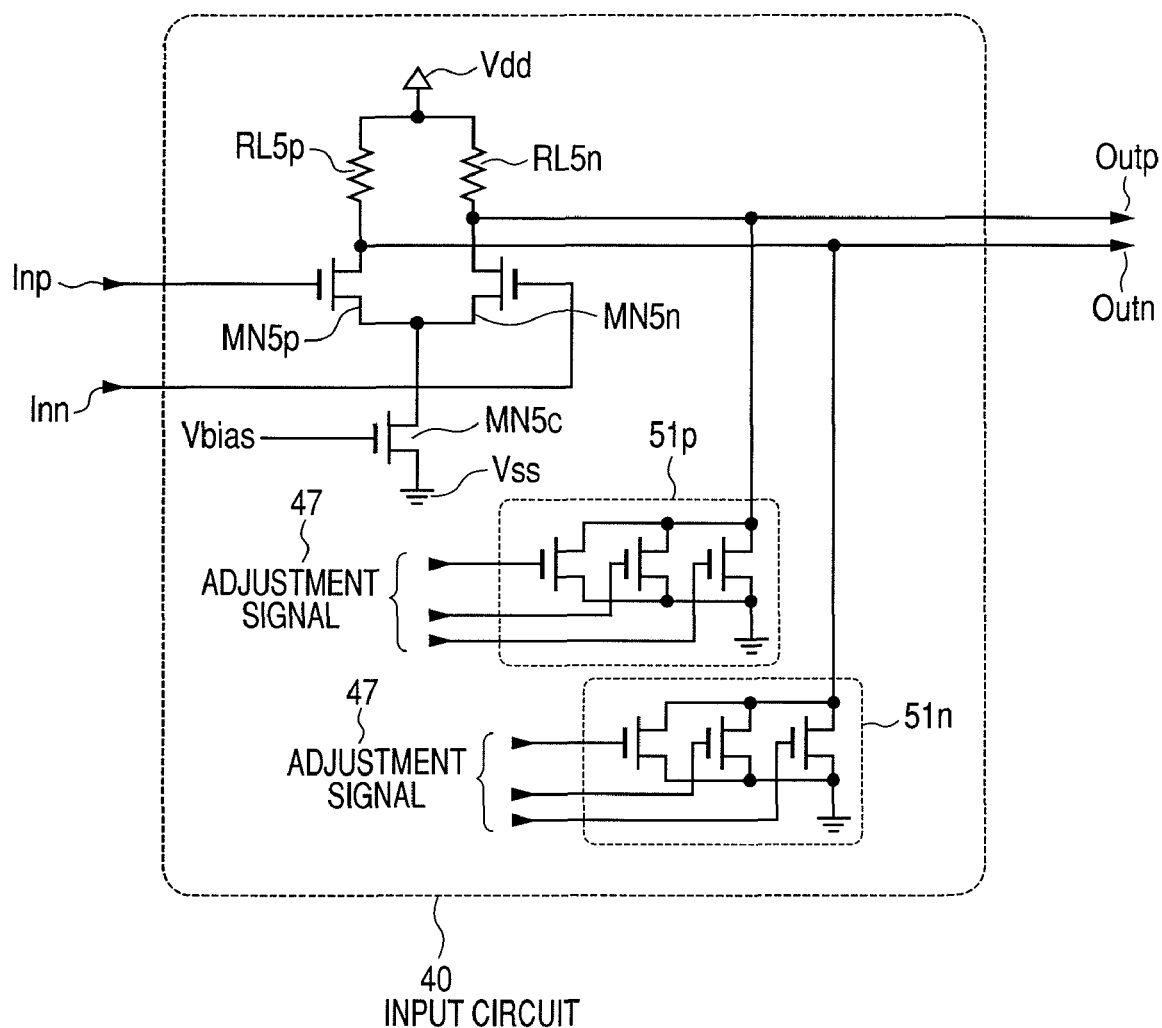
FIG. 5 is an equivalent circuit diagram showing an example of an input circuit in the circuit configuration of the low-offset input circuit according to the first embodiment of the present invention.

FIG. 5 shows an example in a case where the input circuit 40 is realized by a specific circuit. The figure shows a case in which the input circuit 40 is realized by MOS transistors. However, it is apparent that the input circuit 40 is also realized by bipolar transistors.

The circuit has a differential configuration, and receives two differential input signals Inp and Inn to output the two output signals Outp and Outn. The two output terminals are connected with current amount adjustor circuits 51p and 51n that combine plural low current circuits together, respectively. The currents of the current amount adjuster circuits 51p and 51n are controlled according to the adjustment signal 47. The currents of the current amount adjuster circuits 51p and 51n flow to load resistors RL5p and RL5n of the input circuit, respectively. For that reason, the current amounts of the current adjuster circuits 51p and 51n are adjusted, thereby making it possible to correct the error components of the output signals Outp and Outn which are caused by the circuit characteristic variation of the input circuit 40 per se.

Each of the current amount adjuster circuits 51p and 51n is configured in such a manner that the source terminals and the drain terminals of the plural transistors are connected in parallel. The adjustment signal 47 is supplied to the gate terminals of the respective transistors. The adjustment signal 47 is a digital signal, and controls the on/off operation of the respective transistors. The gate widths of the respective transistors are designed to, for example, one time, twice, and four times, thereby enabling eight kinds of current amounts to be set according to the adjustment signal of three bits.

As a method of correcting the error component of the output signal which is caused by the circuit characteristic variation, there has been proposed a method of controlling the resistances of, for example, load resistors RL5$p$ and RL5$n$ other than the means shown in this example. However, the essence of the present invention resides in that there is used the input circuit having means for correcting the circuit characteristic variation, and the correcting means can be changed.

Figure 6A:
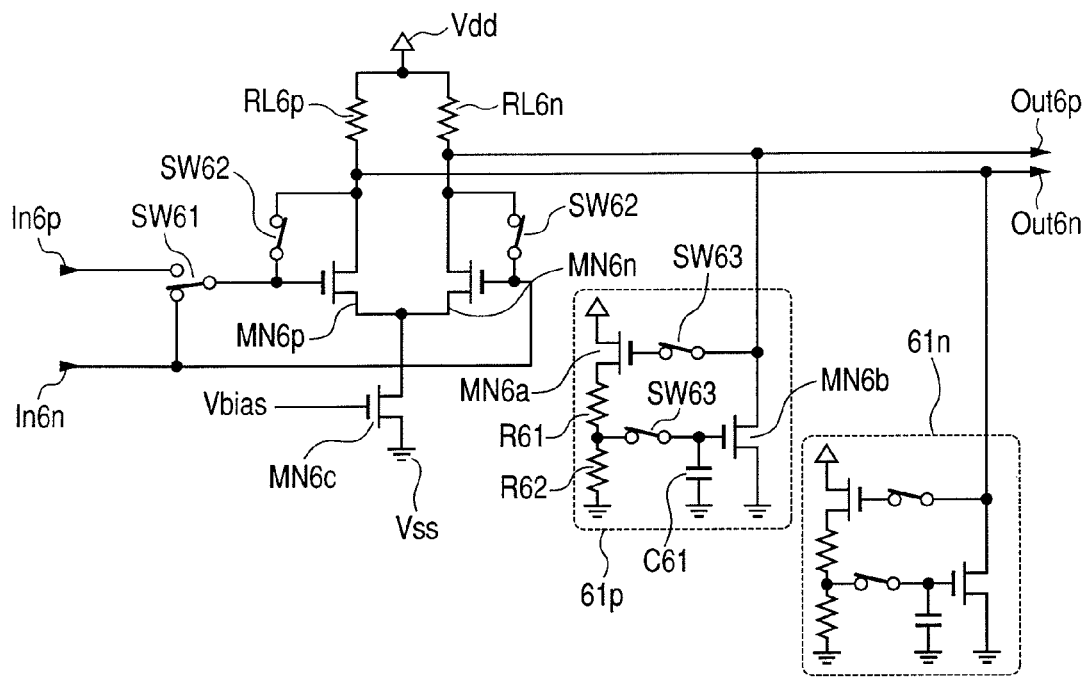
Figure 6B:
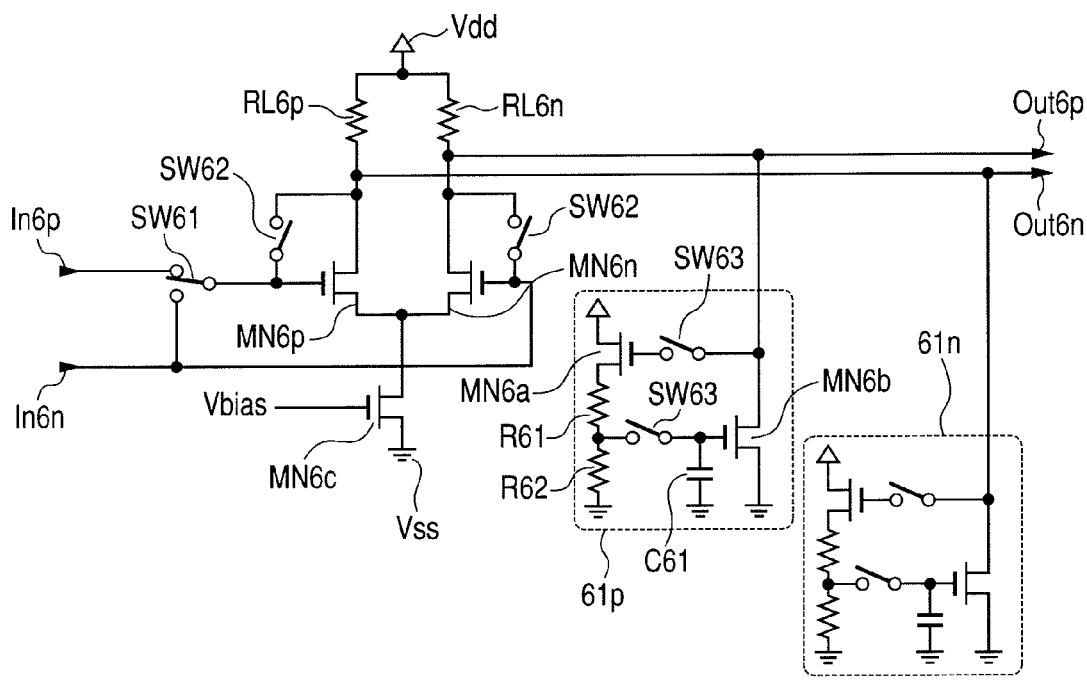

FIGS. 6A and 6B show an example in the case where the automatic zero amplifier 42 is realized by a specific circuit. FIGS. 6A and 6B show a case in which the automatic zero amplifiers 42 are realized by MOS transistors. However, it is apparent that the automatic zero amplifiers 42 can be realized by bipolar transistors.

The automatic zero amplifier 42 has positive side and negative side input terminals In6$p$ and In6$n$, and positive side and negative side output terminals Out6$p$ and Out6$n$. The automatic zero amplifier 42 includes input transistors MN6$p$ and MN6$n$, load resistors RL6$p$ and RL6$n$, a transistor MN6$c$ that constitutes a constant current circuit, a bias voltage Vbias, current amount adjuster circuits 61$p$ and 61$n$, a switch SW61 that short-circuits between the input terminals, a switch SW62$p$ that short-circuits between the positive side input and the negative side output, and a switch SW62$n$ that short-circuits between the negative side input and the positive side output.

The current amount adjuster circuit 61$p$ includes transistors MN6$a$, Mn6$b$, resistors R61, R62, and a switch SW63. The entirely same configuration is also applied to the current amount adjuster circuit 61$p$.

FIG. 6A shows a state in which the circuit characteristic variation of the automatic zero amplifier per se is adjusted. In this case, the switch SW61 short-circuits between the input terminals. Also, the positive side input and the negative side output, and the negative side input and the positive side output are short-circuited by the switch SW62, respectively.

In the above state, the positive side output Out6$p$ and the negative side output Out6$n$ have the same voltage value. For that reason, for example, even if the characteristic variation occurs between the mutual transistors MN6$p$ and MN6$n$ or between the mutual load resistors RL6$p$ and RL6$n$, a current required to correct the variation amount flows in the current amount adjuster circuits 61$p$ and 61$n$ that are connected to the two output terminals Out6$p$ and Out6$n$, respectively. Accordingly, the charge quantity that is charged in the capacitor C61 of the current amount adjuster circuit in that state becomes a signal quantity required to correct the circuit characteristic variation of the automatic zero amplifier 42.

FIG. 6B shows a state in which the automatic zero amplifier 42 is used as the normal amplifier circuit. In this case, the switch SW61 is in a state of FIG. 6B, and the input signals In6$p$ and In6$n$ are transmitted to the input transistors MN6$p$ and MN6$n$, respectively. The switch SW62 gets opened, and the differential circuit conducts the operation of amplifying the input signal. The switch SW63 of the current amount adjuster circuit is opened, and continuously holds the circuit characteristic variation correction signal amount that is charged in the capacitor C61.

Figure 7:
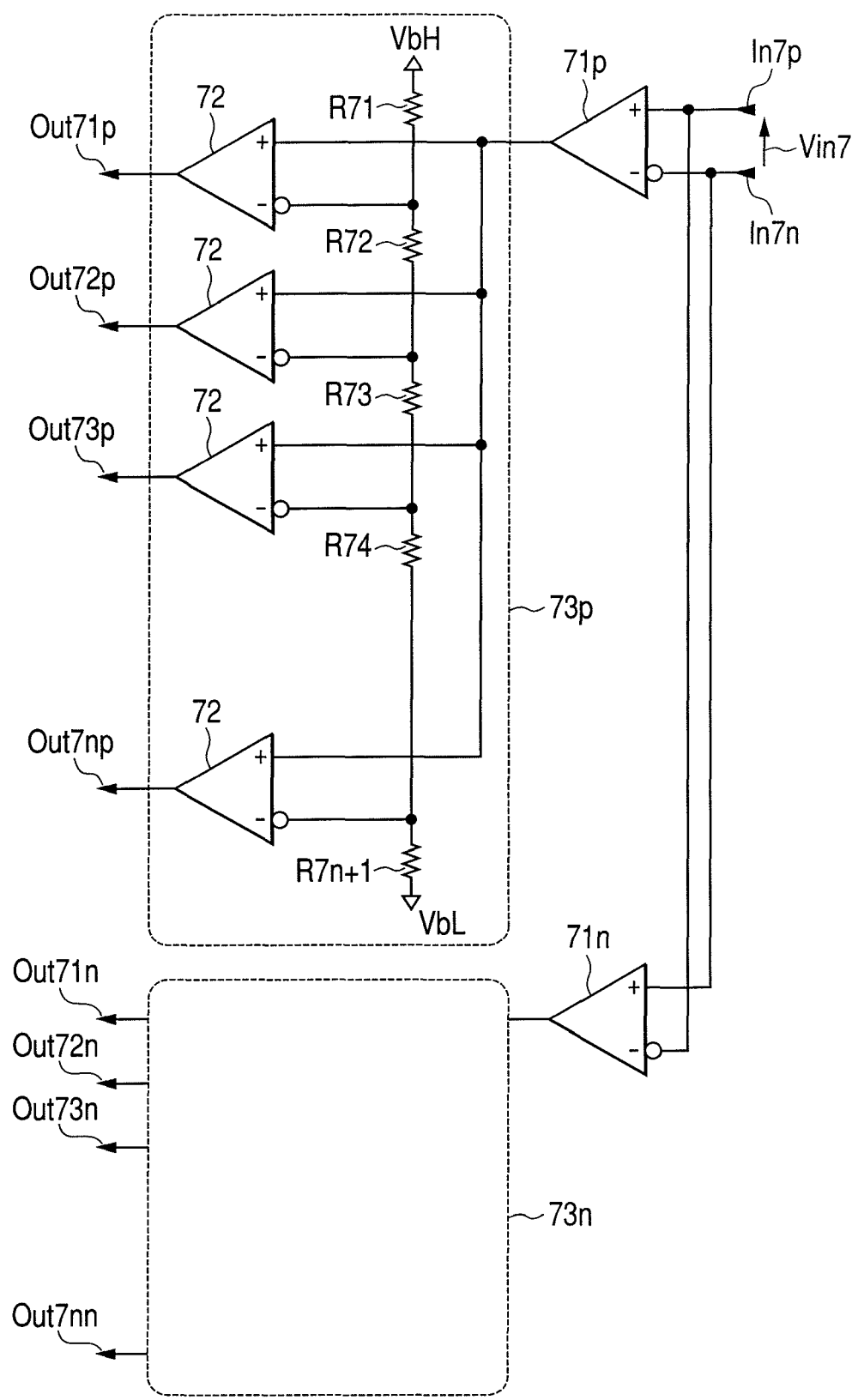
FIG. 7 is an equivalent circuit showing an example of a converter circuit that converts an analog signal into a digital signal in the circuit configuration of the low-offset input circuit according to the first embodiment of the present invention.

FIG. 7 is a diagram showing an example of the AD converter circuit 43. Input signals In7$p$ and In7$n$ are input to differential amplifiers 71$p$ and 71$n$. The output signal of the differential amplifier 71$p$ is input to the respective positive side input terminals of plural differential amplifiers 72 of a circuit block 73$p$. The negative side input terminals of those differential amplifiers 72 are applied with reference voltages that are developed from resistors R71, R72, ... R7$n$+1, a positive side power supply VbH, and a negative side power supply VbL, respectively. The respective differential amplifiers 72 output the outputs corresponding to the positive and negative relation of the signal at the positive side input terminal and the reference voltage at the negative side input terminal to output terminals Out71$p$, Out72$p$, ..., Out7$np$, and Out71$n$, Out72$n$, ..., Out7$nn$. In this situation, 1 is output to any one of the output terminals Out71$p$ to Out7$np$ when the difference signal Vin7 between the input signals In7$p$ and In7$n$ is positive. A circuit block 73$n$ has the same configuration as that of the circuit block 73$n$, and 1 is output to any one of the output terminals Out71$n$ to Out7$nn$ when the difference signal Vin7 is negative. For that reason, any bit of the output terminals Out71$p$, Out72$p$, ..., Out7$np$, Out71$n$, Out72$n$, ..., Out7$nn$ outputs 1 according to the magnitude of the difference signal Vin7 between the input signals In7$p$ and In7$n$ with signs, and other bits output 0. As a result, the analog signal can be converted into the digital signal.

It is apparent that the configuration in which the number of bits of an output digital signal is increased or decreased as the occasion demands can be realized by appropriately setting the number of resistors R7$n$+1 from the resistor R71 and the number of amplifier circuit 72.

There has been known a large number of methods for realizing the circuit that converts the analog signal into the digital signal other than the method shown in FIG. 7. There can be also applied the analog/digital converter circuit using another realizing method.

Figure 8:
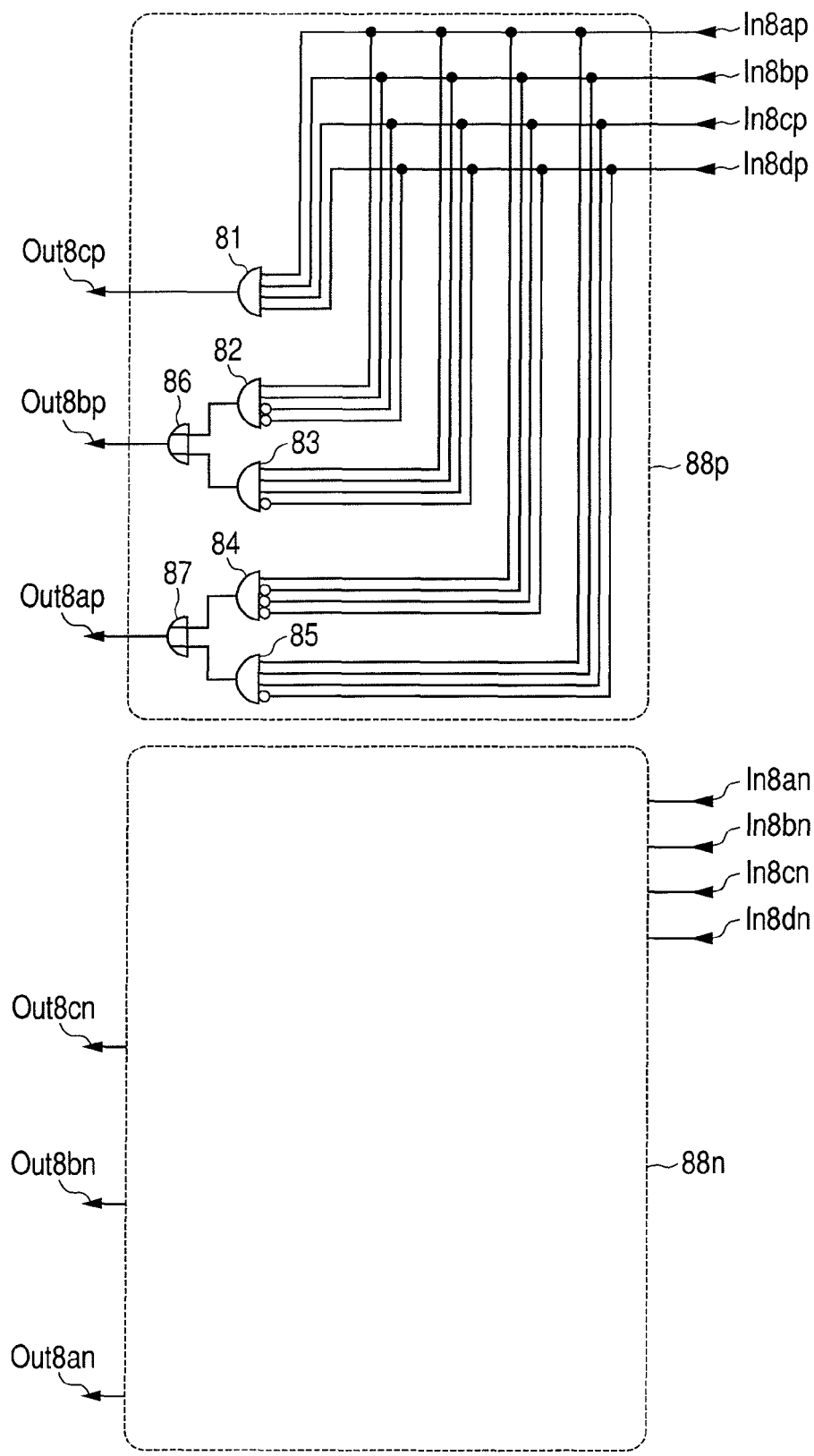
FIG. 8 is an equivalent circuit showing an example of an encoder circuit in the circuit configuration of the low-offset input circuit according to the first embodiment of the present invention.

FIG. 8 is a diagram showing an example of the encoding circuit 44. An encoder circuit block 88$p$ having input terminals In8$ap$ to In8$dp$, and output terminals Out8$ap$ to Out8$cp$ is configured by the combination of AND circuits 81 to 85, and OR circuits 86, 87. Each of the input terminals of the AND circuits 81 to 85 is provided with a function of inverting a signal as the occasion demands. For example, in the case of a connection shown in FIG. 8, when 0000 is input to the input terminals In8$ap$ to In8$pd$, 000 is output to the output terminals Out8$cp$ to Out8$ap$. When 1000 is input to the input terminals In8$ap$ to In8$pd$, 001 is output to the output terminals Out8$cp$ to Out8$ap$. An encoder circuit block 88$n$ having input terminals In8$an$ to In8$dn$ and output terminals Out8$an$ to Out8$cn$ also has the entirely same configuration as that of the encoder circuit block 88$p$. The encoder circuit block 88$p$ is so connected as to encode the converted outputs Out71$p$, Out72$p$, ..., Out7$np$ shown in FIG. 7, and the encoder circuit block 88$n$ is so connected as to encode the converted outputs Out71$n$, Out72$n$, ..., Out7$nn$.

It is well known that the encoder circuit is capable of obtaining an arbitrary output with respect to an arbitrary input with a change in the connection of the AND circuits, the OR circuits, and the signal inverting function.

Figure 9:
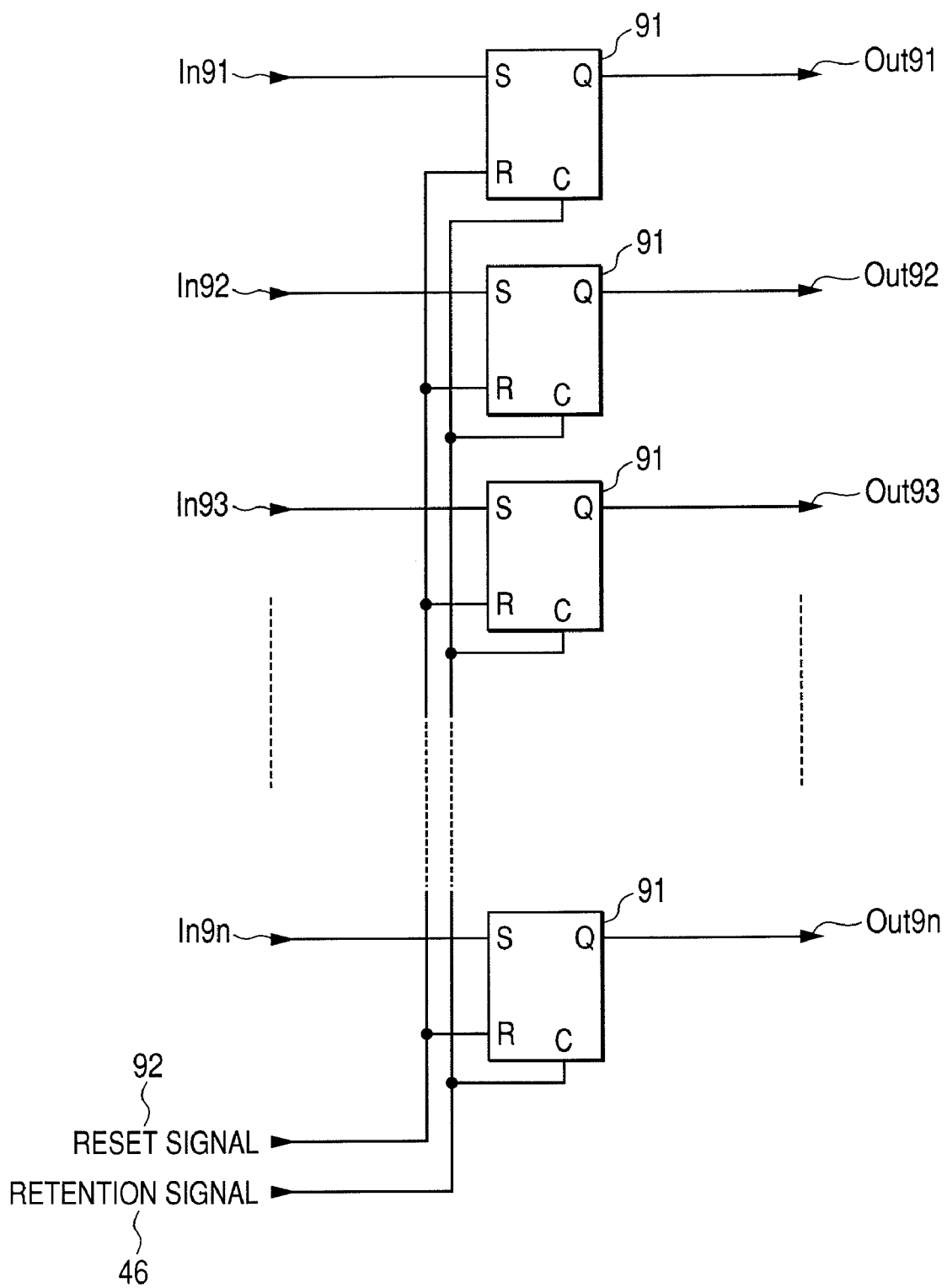
FIG. 9 is an equivalent circuit showing an example of a holding circuit in the circuit configuration of the low-offset input circuit according to the first embodiment of the present invention.

FIG. 9 is a diagram showing an example of the circuit 45 that holds the digital signal. The holding circuit can be realized by the provision of a required number of flip-flop circuits 91 each having a set terminal S, a reset terminal R, and a clock signal terminal C. Reference symbols In91 to In9$n$ denote the input signal terminals of the holding circuit 45, and Out91 to Out9$n$ are the output signal terminals of the holding circuit 45. A retention signal 46 is input to the clock terminals C of the flip-flop circuits.

When the retention signal is 0, each of the flip-flop circuits 91 outputs a signal that is supplied to the set terminal S to the output terminal Q. When the retention signal 46 becomes 1, each of the flip-flop circuits 91 holds the signal Q that has been output at that time. When the reset signal 92 becomes 1, the output Q of the flip-flop circuit 91 is reset to 0.

With the above operation, the circuit shown in FIG. 9 is capable of holding the respective input signals In91 to In9n at a time when the retention signal 46 becomes 1.

Figure 10:
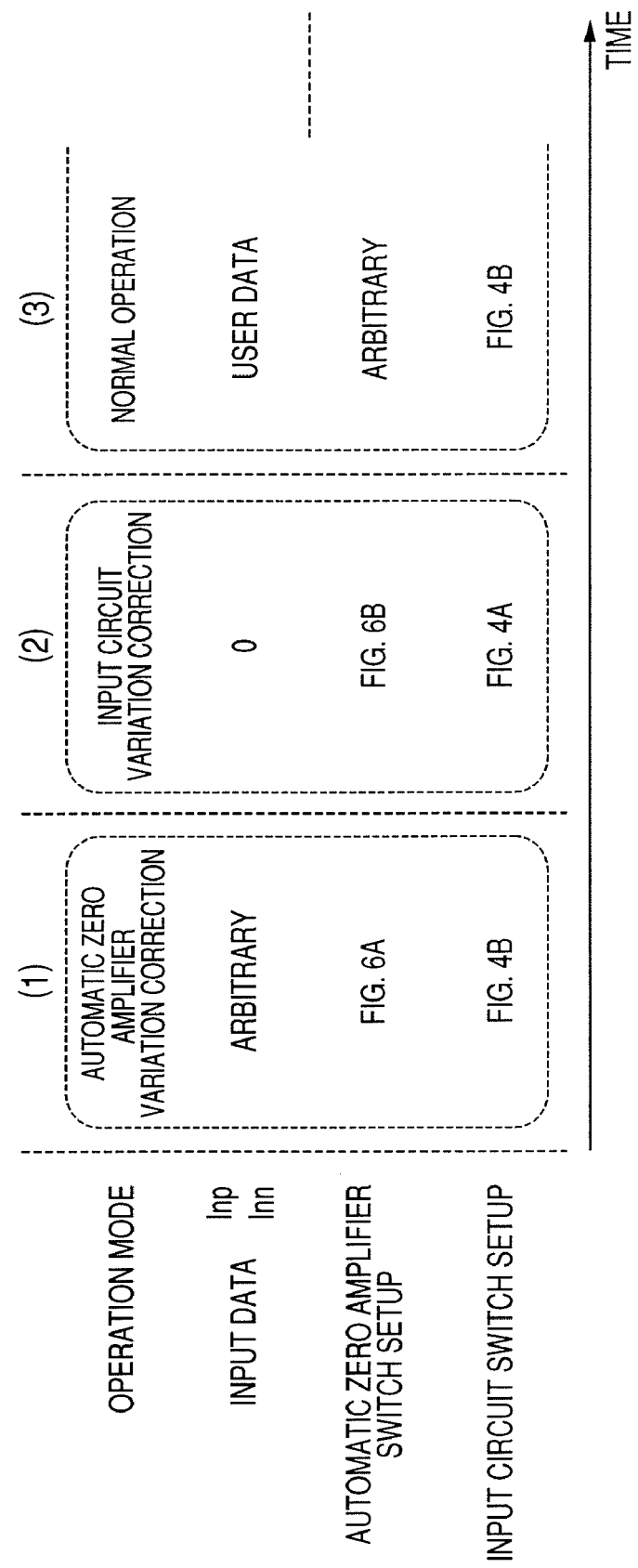
FIG. 10 is a diagram showing the transition of an operation mode of the low-offset input circuit according to the first embodiment of the present invention.

FIG. 10 is a diagram showing the transition of the operating state of the low-offset input circuit according to the first embodiment of the present invention as shown in FIGS. 4A and 4B. The axis of abscissas represents a time elapse.

First, in a state (1), the circuit characteristic variation of the automatic zero amplifier 42 is corrected. In this situation, the input data Inp and Inn can be arbitrary data. The open/close states of the switches SW61 to SW63 of the automatic zero amplifier 42 are set as shown in FIG. 6A. The open/close state of the switch SW41 of the low-offset input circuit is set as shown in FIG. 4B. With the above setup, the circuit characteristic variation of the automatic zero amplifier 42 per se can be corrected, and the correction signal is stored in the capacitor C61 within the automatic zero amplifier 42.

Then, the state (1) is transited to a state (2). In this state, the circuit characteristic variation of the input circuit 40 is corrected. In this situation, it is assumed that the input signal that is supplied to the input circuit is 0. The state of the switch of the automatic zero amplifier 42 is set as shown in FIG. 6B. The state of the switch of the low-offset input circuit is set as shown in FIG. 4A. With the above setup, the output of the input circuit 40 can be fed back through the automatic zero amplifier 42, and the circuit characteristic variation of the input circuit 40 can be corrected.

In a state where the correction amount of the input circuit 40 is determined, when the retention signal 46 is set to 1, the circuit characteristic variation correction signal of the input circuit 40 is sampled by the holding circuit 45, and thereafter held.

Figure 14:
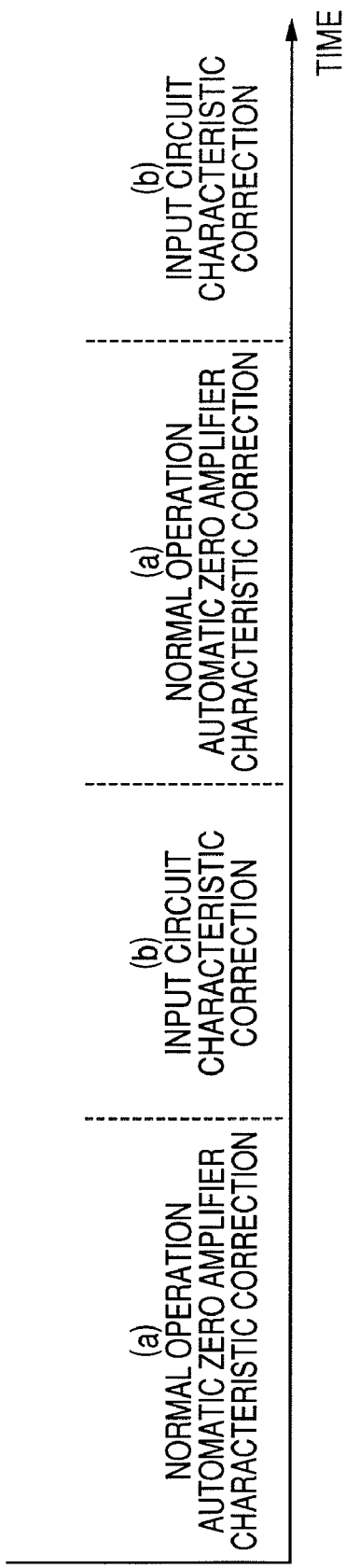
FIG. 14 is a diagram showing the transition of the operating state of the conventional art shown in FIGS. 3A and 3B which has been studied with a view to the present invention.

Then, the state (2) is transited to a state (3). In this state, the input circuit 40 conducts the operation of receiving the normal user signal. According to the embodiment of the present invention which has been described with reference to FIGS. 4A and 4B, since the circuit characteristic variation correction signal of the input circuit 40 is held by the holding circuit 45 as it is, it is unnecessary to repeat the normal operation and the input circuit correcting operation as described in the conventional example shown in FIGS. 3A, 3B and 14.

The transition of the operating state according to the present invention has been described above with reference to FIG. 10. In the description of the example, it is possible to continue the normal operation shown in the state (3) of FIG. 10. However, it is not always necessary to continue that state. For example, in an electric transmission portion of a long-distance communication device using an optical fiber, a period of time during which no data is transmitted really exists in the normal data transmission state. The above transmission state is generally called "burst transmission".

In the transmission device including the burst transmission state, the states (1) and (2) shown in FIG. 10 are appropriately executed during a period of time when no data is transmitted, thereby enabling the circuit characteristic variation to be again corrected. The above variation correction adjustment during the operation is effective in, for example, a change in the temperature environment of the overall device, a variation in the supply voltage in a long period, and a correction of the circuit characteristic variation which is caused by a change in a semiconductor device with time.

Figure 11:
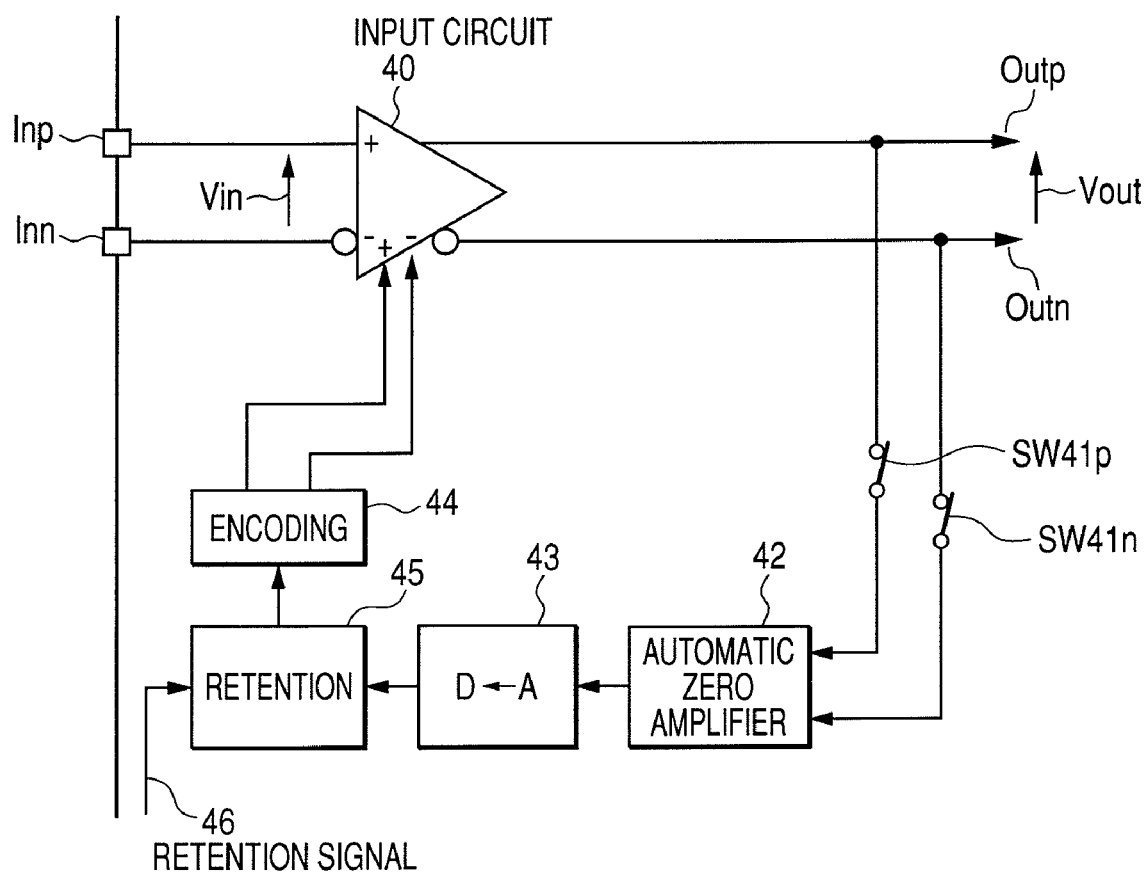
FIG. 11 is a diagram showing the outline configuration of a low-offset input circuit according to a second embodiment of the present invention.

FIG. 11 is a diagram showing a low-offset input circuit according to a second embodiment of the present invention. In this embodiment, the order of the encoder circuit 44 and the holding circuit 45 is counterchanged in the first embodiment shown in FIGS. 4A and 4B. Because all of signals downstream of the output of the analog/digital converter circuit 43 are digitalized, the object of the present invention can be achieved even by the configuration that holds signals that have not yet been encoded as shown in FIG. 11. The state setup of the respective switches for correcting the circuit characteristic variation is identical with that in the case of FIGS. 4A and 4B, and therefore its description will be omitted.

Figure 12:
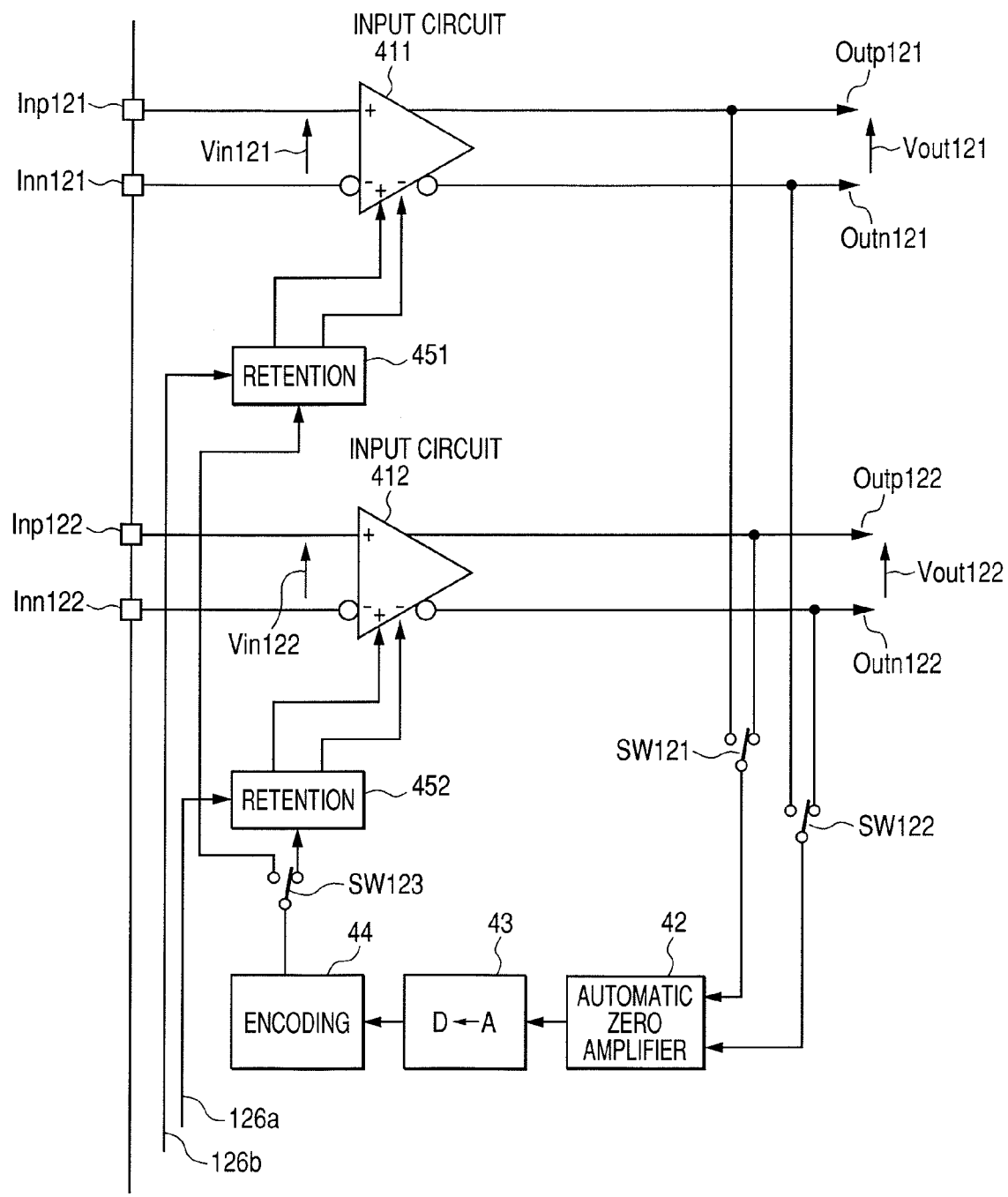
FIG. 12 is a diagram showing the outline configuration of a low-offset input circuit according to a third embodiment of the present invention.

FIG. 12 is a diagram showing a low-offset input circuit according to a third embodiment of the present invention. In the figure, two pairs of input circuits and holding circuits are shown. An input circuit 411 and a holding circuit 451 are paired, and an input circuit 412 and a holding circuit 452 are paired. On the contrary, the automatic zero amplifier 42, the analog/digital converter circuit 43, and the encoder circuit 44 are disposed one by one.

The output of the input circuit 411 and the output of the input circuit 412 can change over by means of switches SW121 and SW122, and any one of those switches SW121 and SW122 is connected to the analog/digital circuit 42. The output of the encoder circuit 44 is connected to any one of the holding circuit 451 and the holding circuit 452 through a switch SW123. With the above configuration, one pair of the automatic zero amplifier 42, the analog/digital circuit 43, and the encoder circuit 44 are used in time division, and the circuit characteristic variations of the two input circuits 411 and 412 are so corrected as to hold the correction signal. In the figure, two pairs of input circuits and holding circuits are shown. However, it is apparent that the low-offset input circuit can be likewise realized by three or more pairs of those circuits.

Figure 13:
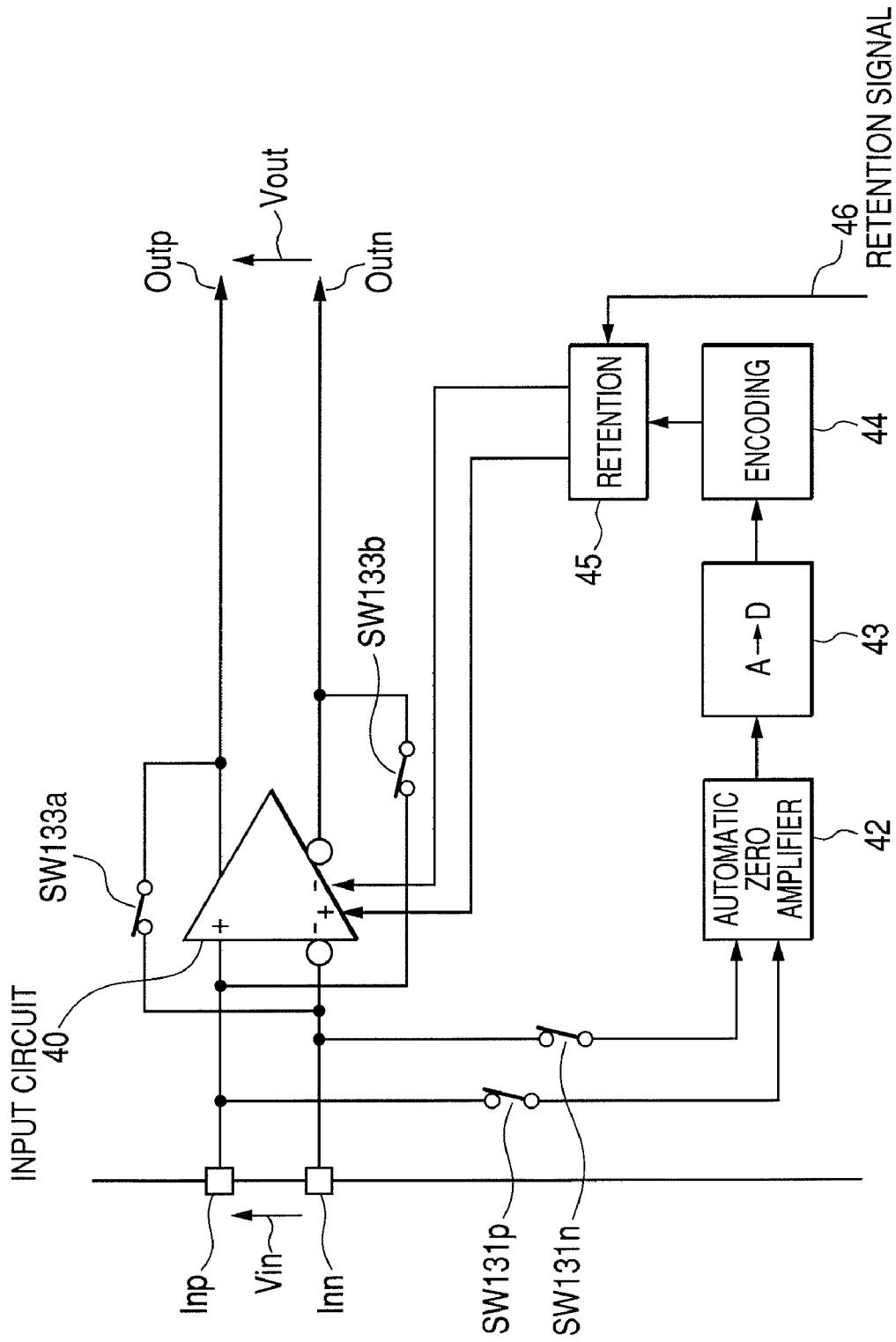
FIG. 13 is a diagram showing the outline configuration of a low-offset input circuit according to a fourth embodiment of the present invention.

FIG. 13 is a diagram showing a low-offset input circuit according to a fourth embodiment of the present invention. In the figure, the input of the automatic zero amplifier 42 is taken from the input terminals Inp and Inn of the input circuit 40 through switches SW131p and SW131n. The circuit connection downstream of the output of the automatic zero amplifier 42 is identical with that according to the first embodiment of the present invention shown in FIGS. 4A and 4B.

This embodiment further includes a switch SW133a that connects between the positive side output terminal and the negative side input terminal of the input circuit 40, and a switch SW133b that connects between the negative side output terminal and the positive side input terminal.

In FIG. 13, all of the switches SW131p, SW131n, SW133a, and SW133b are closed. In this situation, the input circuit 40 conducts the circuit characteristic variation correcting operation. The state in which the circuit characteristic variation of the automatic zero amplifier 42 per se is corrected reaches before the state shown in FIG. 13, and the state in which the input circuit 41 conducts the normal data receiving operation reaches after the state shown in FIG. 13 as in the first embodiment of the present invention which is described with reference to FIGS. 4A and 4B.

The state in which the normal data receiving operation is conducted is realized by opening all of the switches SW131p, SW131n, SW133a, and SW133b.

In the fourth embodiment according to the present invention shown in FIG. 13, because the switches SW13 and SW23 are connected to the input terminal of the input circuit 41, a load on the input terminal of the input circuit 40 is increased. As a result, the high-speed operation of the circuit is more limited as compared with the first embodiment shown in FIGS. 4A and 4B. However, the essence of the present invention that the information for correcting the circuit characteristic variation of the input circuit per se is digitalized and held is not lost.

The low-offset input circuit according to the present invention is particularly useful as performance deterioration preventing means in a system wherein the circuit characteristic variation of a signal receiver circuit unignorably affects the amplitude of the received signal, such as the receiver circuit with respect to serial signal transmission between LSI in an information processing device represented by, for example, a computer or a network device. The present invention is not limited to the above, but can be widely applied as the signal receiver circuit of the electric signal portion in a system such as an Ethernet signal transmission device using an optical transmission technique.

What is claimed is:

1. The low-offset input circuit comprising:
an input circuit that receives a signal;
an amplifier circuit that is connected to reflect a circuit characteristic variation that develops an offset voltage of the input circuit to an output;
an adjusting section that adjusts the circuit characteristic variation of the input circuit according to an adjustment signal;
a converter circuit that converts an output signal of the amplifier circuit into a digital signal; and
a holding circuit that samples and holds one of the digital signal that has been converted by the converter circuit and a signal resulting from encoding the converted digital signal,
wherein the amplifier circuit has a function of correcting the circuit characteristic variation of the amplifier circuit, and
wherein the adjusting section corrects the circuit characteristic variation of the input circuit upon receiving the signal that is held by the holding circuit,
wherein the amplifier circuit has a first state in which the amplifier circuit corrects the circuit characteristic variation of the amplifier circuit, and a second state in which the amplifier circuit reflects the circuit characteristic variation of the input circuit to an output, and
wherein the holding circuit samples one of the digital signal and the encoded signal at a time when the amplifier circuit is brought in the second state, and the adjusting section corrects the circuit characteristic variation of the input circuit upon receiving a sampled retention signal.

2. The low-offset input circuit according to claim 1, wherein the input circuit becomes in a first operating state where the input circuit receives the signal after the circuit characteristic variation is corrected according to the retention signal that is sampled by the holding circuit.

3. The low-offset input circuit according to claim 1, wherein the amplifier circuit becomes in the first state where the amplifier circuit corrects the circuit characteristic variation of the amplifier circuit per se during a period when the input circuit is in the first operating state.

4. The low-offset input circuit according to claim 1, wherein the holding circuit samples one of the digital signal and the encoded signal when an external correction input signal is input to the input circuit, and the amplifier circuit is in the second state where the amplifier circuit reflects the circuit characteristic variation of the input circuit to the output.

5. The low-offset input circuit according to claim 1, wherein the output signal of the input circuit is input to the amplifier circuit so as to be brought in the second state.

6. The low-offset input circuit according to claim 1, wherein the amplifier circuit is connected with an input end of the input circuit in a state where an output end of the input circuit is connected to the input end with reverse polarity, so as to be brought in the second state.

7. A low-offset input circuit, comprising:
a plurality of input circuits that receive respective input signals, each of the input circuits having an adjusting section that adjusts the circuit characteristic variation that develops an offset voltage;
an amplifier circuit that is sequentially connected to the outputs of the plurality of input circuits through a changeover switch so as to sequentially reflect the respective circuit characteristic variations of the plurality of input circuits to an output;
a converter circuit that converts the output of the amplifier circuit into a digital signal; and
a holding circuit that sequentially samples and holds one of the digital signal which is the output of the converter circuit, and a signal resulting from encoding the digital signal when the amplifier circuit reflects the respective circuit characteristic variations of the plurality of input circuits to the output, and
wherein the respective adjusting section of the plurality of input circuits corrects the respective circuit characteristic variations upon receiving respective retention signals which are held by the holding circuit.

8. The low-offset input circuit according to claim 7, wherein the amplifier circuit has a function of correcting the circuit characteristic variation of the amplifier circuit per se, and is sequentially connected to the outputs of the plurality of input circuits after the circuit characteristic variation of the amplifier circuit per se is corrected.

* * * * *